(12) United States Patent
Lin et al.

(10) Patent No.: US 9,390,952 B2
(45) Date of Patent: Jul. 12, 2016

(54) DEVICE AND METHOD FOR LOADING AND UNLOADING QUARTZ REACTION TUBE TO AND FROM SEMICONDUCTOR DIFFUSION EQUIPMENT

(71) Applicants: Xinjia Lin, Beijing (CN); Qi Hao, Beijing (CN); Jinwei Dong, Beijing (CN)

(72) Inventors: Xinjia Lin, Beijing (CN); Qi Hao, Beijing (CN); Jinwei Dong, Beijing (CN)

(73) Assignee: BEIJING SEVENSTAR ELECTRONICS CO., LTD., Beijing (CN)

( * ) Notice: Subject to any disclaimer, the term of this patent is extended or adjusted under 35 U.S.C. 154(b) by 0 days.

(21) Appl. No.: 14/520,343

(22) Filed: Oct. 22, 2014

(65) Prior Publication Data

US 2015/0151772 A1   Jun. 4, 2015

(30) Foreign Application Priority Data

Nov. 29, 2013  (CN) .......................... 2013 1 0628388

(51) Int. Cl.
*H01L 21/677*   (2006.01)
*B62B 3/04*   (2006.01)
*B62B 3/10*   (2006.01)

(52) U.S. Cl.
CPC ............ *H01L 21/67724* (2013.01); *B62B 3/04* (2013.01); *B62B 3/104* (2013.01)

(58) Field of Classification Search
CPC ............ B62B 3/02; B62B 3/04; B62B 3/104; B23Q 7/1442; H01L 21/67775; H01L 21/67769
See application file for complete search history.

(56) References Cited

U.S. PATENT DOCUMENTS

| | | | | |
|---|---|---|---|---|
| 5,570,990 | A * | 11/1996 | Bonora et al. | 414/543 |
| 5,967,740 | A * | 10/1999 | Pflueger et al. | 414/749.6 |
| 6,033,175 | A * | 3/2000 | Pflueger et al. | 414/401 |
| 6,238,283 | B1 * | 5/2001 | Matsuyama et al. | 454/187 |
| 6,398,476 | B1 * | 6/2002 | Ando | 414/282 |
| 2003/0012626 | A1 * | 1/2003 | Aggarwal | 414/217.1 |
| 2003/0059289 | A1 * | 3/2003 | Yap | 414/541 |
| 2003/0077159 | A1 * | 4/2003 | Iizuka | 414/609 |
| 2003/0187537 | A1 * | 10/2003 | Hocke et al. | 700/121 |
| 2013/0257001 | A1 * | 10/2013 | Pan | 280/47.35 |
| 2013/0259617 | A1 * | 10/2013 | Wang | 414/561 |

* cited by examiner

*Primary Examiner* — Glenn Myers

(57) ABSTRACT

A loading and unloading device and method for a quartz reaction tube of a semiconductor diffusion equipment are provided; the loading and unloading device is used in combination with a lifting device of the quartz reaction tube; the lifting device has an interface flange that can be connected to the reaction tube. The loading and unloading device includes a translation drive structure, a linear guide rail, a bracket, and an auxiliary support structure to detachably fix the quartz reaction tube. During the loading procedure, the auxiliary support structure is mounted on the bracket; the front end of the translation drive structure is docked with the doorframes of the semiconductor diffusion equipment through a fixing structure, and the quartz reaction tube is docked with the interface flange of the lifting device by horizontally moving the bracket along the linear guide rail.

9 Claims, 18 Drawing Sheets

DEVICE AND METHOD FOR LOADING AND UNLOADING QUARTZ REACTION TUBE TO AND FROM SEMICONDUCTOR DIFFUSION EQUIPMENT

CROSS-REFERENCES TO RELATED APPLICATIONS

This application claims the priority of Chinese patent application number 201310628388.5, filed on 29 Nov. 2013, the entire contents of which are incorporated herein by reference.

FIELD OF THE INVENTION

The present invention relates to the field of semiconductor device and semiconductor manufacturing, and more particularly to a device for loading and unloading the quartz reaction tube to and from the reaction chamber of the semiconductor diffusion equipment and a loading and unloading method thereof.

BACKGROUND OF THE INVENTION

As an important process equipment for the integrated circuit fabrication, the semiconductor diffusion equipment is automatically controlled and requires long continuous working time, excellent temperature control precision, and good reliability and stability, so as to be applied to the various oxidation, annealing, and film growth processes during the integrated circuit manufacturing.

The preventive maintenance for the semiconductor diffusion equipment, including regular overhauling, oiling, lubricating and replacing consumable materials, is obviously important to keep the semiconductor diffusion equipment at a better working condition, so as to achieve high equipment working efficiency. The device for loading and unloading the internal components of the semiconductor equipment plays a major role during the maintenance procedure mentioned above.

As a main internal component of the semiconductor diffusion equipment, the quartz reaction tube needs to be unloaded from the semiconductor diffusion equipment when itself or the O-ring thereof is to be replaced or cleaned during the daily, weekly, monthly or annual equipment maintenance time and the down time of the normal operation of the semiconductor diffusion equipment, and needs to be loaded into the semiconductor diffusion equipment when the replacement or cleaning is completed or the tube itself is to be installed into the equipment at a first time.

Those skilled in the art understand that since the overall structure of the semiconductor equipment is compact, the space in the reaction chamber for accommodating the quartz reaction tube with large volume is small. Thus, how to make the quartz reaction tube accurately and smoothly dock with the lifting device for the reaction tube is a bottleneck problem in the field. Particularly, since the quartz reaction tube is easy to be damaged, improving loading and unloading stability of the quartz reaction tube is a more difficult problem.

Presently, the progress of the semiconductor diffusion equipment in China is still in the beginning stage, the developmental level of the related technology and equipment is relatively low, as a result, apparatus specifically designed for loading and unloading the internal components of the semiconductor equipment are still not provided. Furthermore, due to the differences in function, model, and overall structure of the equipment, such apparatus must be designed to be matched with the equipment, which causes poor versatility. Although foreign semiconductor equipment manufacturers, such as TOKYO ELECTRON LIMITED(TEL) and Hitachi Kokusai Electric Co., Ltd(KE), have developed loading devices and unloading devices respectively matched with the diffusion equipment of their own manufacture, the versatility of the devices is still poor, as the loading device or the unloading device cannot be applied to both the loading and unloading procedures.

BRIEF SUMMARY OF THE DISCLOSURE

Accordingly, at least one object of the present invention is to provide a loading and unloading device and method for the quartz reaction tube, which can be applied to various semiconductor diffusion equipment both in China and abroad with operational convenience and high safety.

To achieve above object or another, the present invention provides a loading and unloading device for a quartz reaction tube of a semiconductor diffusion equipment. The device is used in combination with a lifting device for the quartz reaction tube which has an interface flange attachable to the reaction tube. The loading and unloading device includes a translation drive structure, a linear guide rail, a bracket positioned on the linear guide rail, and an auxiliary support structure. The translation drive structure includes a support platform composed of two support plates stacked up and down and a handle connected to the support platform; wherein the lower support plate is fixedly connected to a group of height-adjustable rollers; the linear guide rail is mounted on the upper support plate; the auxiliary support structure works in conjunction with the bracket to detachably fix the quartz reaction tube to the bracket. The auxiliary support structure includes a first interface unit to be connected to the bracket, and a second interface unit to be connected to the bottom assembly of the quartz reaction tube; wherein during the loading procedure, the front end of the translation drive structure is docked with the doorframes of the semiconductor diffusion equipment by a fixing structure, and the quartz reaction tube is docked with the interface flange of the lifting device by horizontally moving the bracket along the linear guide rail.

Preferably, the quartz reaction tube includes an inner tube and an outer tube; the second interface unit includes at least one inner tube interface unit to be connected to the bottom assembly of the inner tube of the quartz reaction tube and/or at least one outer tube interface unit to be connected to the bottom assembly of the outer tube of the quartz reaction tube.

Preferably, the bracket includes a semi-annulus support surface having multiple locating pins provided thereon; the outer tube interface unit includes a hollow cylinder, an edge ring positioned around the periphery of the cylinder and adjoined with the first interface unit, multiple locating holes formed in the edge ring to be engaged with the locating pins on the support surface, and multiple semicircular notches distributed on the periphery of the edge ring; the quantity and positions of the semicircular notches are correspondent to those of the thread through-holes formed in the bottom assembly of the quartz reaction tube.

Preferably, the bracket includes a semi-annulus support surface having multiple locating pins provided thereon; the outer tube interface unit includes a hollow cylinder, an edge ring positioned around the periphery of the cylinder and adjoined with the first interface unit, multiple locating holes formed in the edge ring to be engaged with the locating pins on the support surface; wherein the hollow cylinder has an annulus protrusion formed at the end away from the edge ring.

Preferably, the space between the two stacked support plates is controlled by a space adjusting unit.

Preferably, the space adjusting unit is a rotating and lifting mechanism with a rotating handle.

Preferably, the handle is a lifting handle and is detachably fixed and connected to the support platform.

Preferably, the front end of the translation drive structure is docked with the doorframes of the semiconductor diffusion equipment through locating blocks and locating pins.

Preferably, the lower support plate has multiple linear guide pillars engaged into the through holes of the upper support plate.

The present invention also provides a loading and unloading method for the quartz reaction tube of the semiconductor diffusion equipment by using the device mentioned above. The method includes a loading procedure and an unloading procedure. The loading procedure includes the following steps:

Step S11, placing the first interface unit of the auxiliary support structure on the bracket; placing the bottom of the quartz reaction tube into the second interface unit of the auxiliary support structure;

Step S12, actuating the handle to dock the front end of the translation drive structure with the doorframes of the semiconductor diffusion equipment through the fixing structure;

Step S13, actuating the bracket to horizontally move the quartz reaction tube along the linear guide rail to dock with the interface flange of the lifting device;

Step S14, using the lifting device to lift the quartz reaction tube with the auxiliary support structure up into the reaction chamber of the semiconductor diffusion equipment.

The unloading procedure includes the following steps:

Step S21, actuating the handle to dock the front end of the translation drive structure with the doorframes of the semiconductor diffusion equipment through the fixing structure;

Step S22, using the lifting device to lower the quartz reaction tube with the auxiliary support structure out of the reaction chamber of the semiconductor diffusion equipment;

Step S23, placing the first interface unit of the auxiliary support structure on the bracket;

Step S24, releasing the quartz reaction tube from the interface flange of the lifting device; actuating the bracket to move the quartz reaction tube along the linear guide rail back into the support platform;

Step S25, releasing the front end of the translation drive structure from the doorframes of the semiconductor diffusion equipment, and then using the handle to move the quartz reaction tube away from the semiconductor diffusion equipment.

From above, the loading and unloading device and method of the present invention can achieve high flexibility, accuracy, stability and reliability in operation; furthermore, under the premise of ensuring excellent process effect, the device also has the advantages of high rigidity and reliability, compact structure, and good practicality in small space for the operators.

DETAILED DESCRIPTION

The present invention will now be descried more comprehensively hereinafter with reference to the accompanying drawings, in which preferred embodiments of the invention are shown.

It is noted that the loading and unloading device for the quartz reaction tube of the semiconductor diffusion equipment according to the present invention is used in combination with the lifting device for the quartz reaction tube. The lifting device has an interface flange which can be connected to the reaction tube. The quartz reaction tube applied to the present invention can be the inner tube or the outer tube. During the loading procedure, the outer tube is loaded firstly, and then the inner tube is inserted into the outer tube from the bottom so as to be assembled with the outer tube.

The loading and unloading device of the present invention includes a translation drive structure, a linear guide rail, a bracket positioned on the linear guide rail, and an auxiliary support structure. The translation drive structure includes a support platform composed of two support plates stacked up and down and a handle connected to the support platform; wherein the lower support plate is fixedly connected to a group of height-adjustable rollers; the liner guide rail is mounted on the upper support plate, the auxiliary support structure works in conjunction with the bracket to detachably fix the quartz reaction tube to the bracket. The auxiliary support structure includes a first interface unit that can be connected to the bracket, and a second interface unit that can be connected to the bottom assembly of the quartz reaction tube; wherein during the loading procedure, the front end of the translation drive structure is docked with the doorframes of the semiconductor diffusion equipment by a fixing structure, and the quartz reaction tube is docked with the interface flange of the lifting device by horizontally moving the bracket along the linear guide rail.

Figure 1:
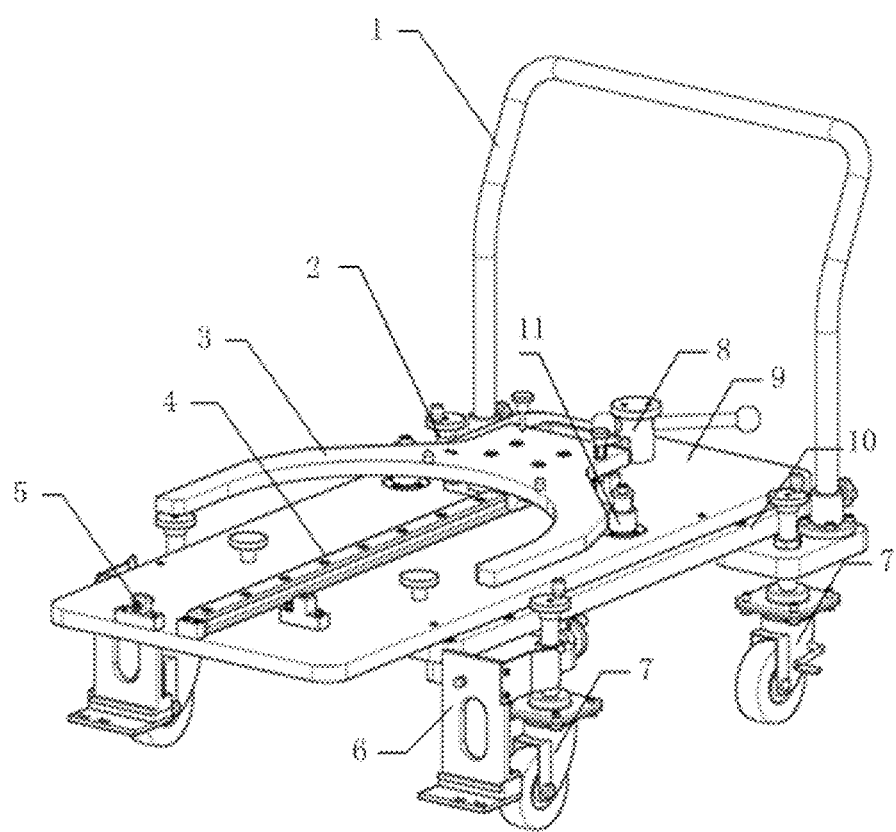
FIG. 1 is an overall structural view of the loading and unloading device for the quartz reaction tube of the semiconductor diffusion equipment according to one embodiment of the present invention.

FIG. 1 is an overall structural view of the loading and unloading device for the quartz reaction tube of the semiconductor diffusion equipment according to one embodiment of the present invention. As shown in FIG. 1, the main structures of the device are referenced by the reference numbers. The main structures include a translation handle 1, a lift handle 2, a bracket 3, a linear guide rail 4, a locating block 5, locating plates 6, a group of rollers 7, a rotating and lifting mechanism 8, an upper support plate 9, a lower support plate 10, and linear guide pillars 11. As can be seen in the figure, the appearance of the whole device is like a push-pull all-direction mobile trolley. The lift handle 2 adjusts the overall height of the device; the bracket 3 horizontally moves forward and back along the linear guide rail 4 to push or pull the quartz reaction tube (not shown in FIG. 1) into or out of the process environment; the locating block 5 limits the position of the bracket 3; the rotating and lifting mechanism 8 adjusts the relative height between the upper support plate 9 and the lower support plate 10; the locating plates 6 determines the relative position between the loading and unloading device and the diffusion equipment; the rollers 7 and the handle 1 make the device move.

At the beginning of the loading procedure, the quartz reaction tube is detachably fixed to the auxiliary support structure and the bottom of the quartz reaction tube is mounted on the bracket 3 through the auxiliary support structure. The auxiliary support structure includes a first interface unit to be connected to the bracket 3 and a second interface unit to be connected to the bottom assembly of the quartz reaction tube. During the loading procedure, the front end of the translation drive structure is docked with the doorframes of the semiconductor diffusion equipment by a fixing structure, and the quartz reaction tube is docked with the flange of the lifting gear by horizontally moving the bracket 3 along the linear guide 4.

In one embodiment of the present invention, the quartz reaction tube can be an inner tube or an outer tube; the second interface unit can be divided into an inner tube interface unit and an outer tube interface unit. The inner tube interface unit is provided to be connected with the bottom assembly of the inner tube of the quartz reaction tube, while the outer tube interface unit is provided to be connected with the bottom assembly of the outer tube of the quartz reaction tube.

Figure 2:
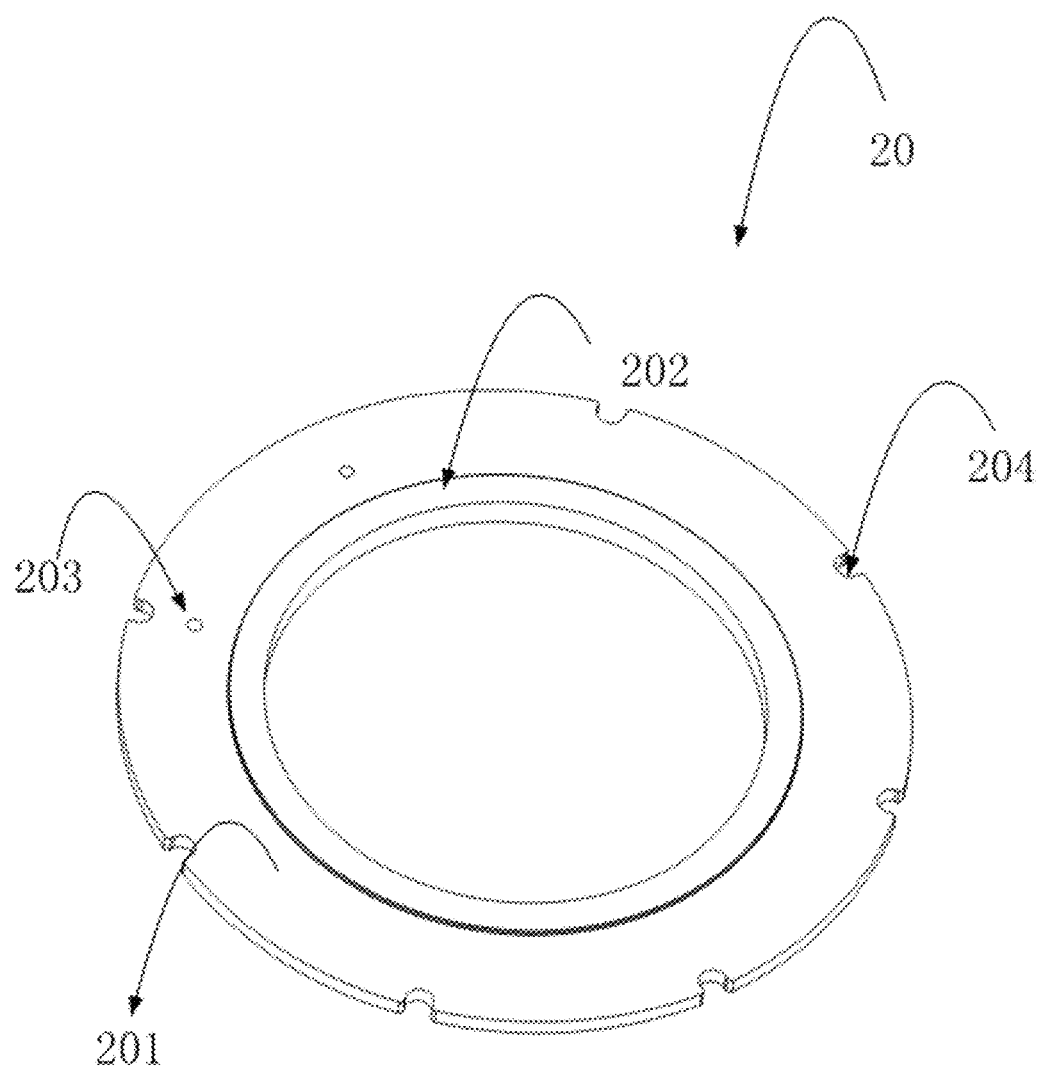
FIG. 2 is a structural view of the auxiliary support structure of the outer tube of the quartz reaction tube according to one embodiment of the present invention.

FIG. 2 is a structural view of the auxiliary support structure of the outer tube of the quartz reaction tube according to one embodiment of the present invention. As shown in FIG. 2, the auxiliary support structure 20 includes a first interface unit to be connected to the bracket 3, and a second interface unit to be connected to the bottom assembly of the quartz reaction tube. As shown in FIG. 1 and FIG. 2, the bracket 3 includes a semi-annulus support surface with multiple locating pins provided thereon. The outer tube interface unit includes a hollow cylinder 202, an edge ring 201 positioned around the periphery of the cylinder 202 and adjoined with the first interface unit, two locating holes 203 formed in the edge ring 201 and multiple semicircular notches 204 distributed on the periphery of the edge ring 201. The locating holes 203 can be engaged with the locating pins on the support surface. There is a one-to-one correspondence relationship of the quantity and positions between the semicircular notches 204 and the thread through-holes formed in the bottom assembly of the quartz reaction outer tube.

The auxiliary support structure mentioned above ensures the loading accuracy of the outer tube (the concentricity of the outer tube and the reaction chamber), meanwhile prevents the contamination caused by the direct contact of the outer tube and the bracket 3, and further avoids the damage occurred during the connection and separation of the quartz reaction tube and the bracket 3.

Figure 3:
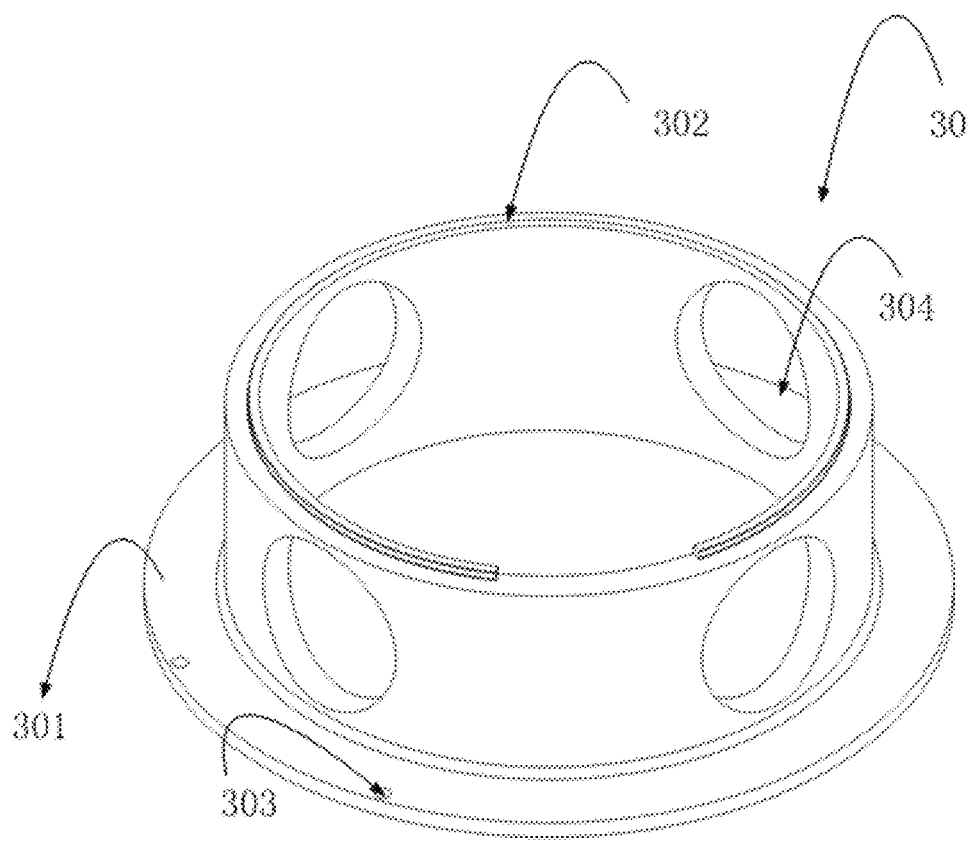
FIG. 3 is a structural view of the auxiliary support structure of the inner tube of the quartz reaction tube according to one embodiment of the present invention.

FIG. 3 is a structural view of the auxiliary support structure of the inner tube of the quartz reaction tube according to one embodiment of the present invention. As shown in FIG. 3, the auxiliary support structure 30 includes a first interface unit to be connected to the bracket 3, and a second interface unit to be connected to the bottom assembly of the inner tube of the quartz reaction tube. As shown in FIG. 1 and FIG. 3, the bracket 3 includes a semi-annulus support surface with multiple locating pins thereon; the inner tube interface unit includes a hollow cylinder 302, an edge ring 301 positioned around the periphery of the cylinder and adjoined with the first interface unit, two locating holes 303 formed in the edge ring 301 and multiple semicircular notches 304 distributed on the periphery of the edge ring 301. The locating holes 303 can be engaged with the locating pins on the support surface. Wherein, an annulus protrusion is formed at the end of the hollow cylinder 302 away from the edge ring 301. For reducing the weight, the hollow cylinder 302 has a hollowed-out structure. The pattern of the hollowed-out structure can be any shape. In the embodiment, the hollowed-out structure is composed of four circles uniformly distributed on the annular side wall of the hollow cylinder 302.

The auxiliary support structure mentioned above ensures the loading accuracy of the inner tube (concentricity of the inner tube and the reaction chamber), meanwhile prevents the contamination caused by the direct contact of the inner tube and the bracket 3, and further avoids the damage occurred during the connection and separation of the quartz reaction tube and the bracket 3, which protects the inner tube. Therefore, the two auxiliary support structures mentioned above can be designed and adjusted according to different structures of the quartz reaction tube, so as to achieve high versatility.

Referring to FIG. 1 again, in the embodiment, in addition to the group of the rollers 7 with an adjustable height, the two support plates 9, 10 stacked up and down also have a space therebetween which can be controlled by a space adjusting unit. The space adjusting unit can be a rotating and lifting mechanism 8 with a rotating handle. Furthermore, the handle 1 can be moved up and down as required, and can be detachably fixed and connected to the support platform. The front end of the translation drive structure can be docked with the doorframes of the semiconductor diffusion equipment through locating blocks and locating pins. The lower support plate 10 has multiple linear guide pillars 11 engaged into the through-holes of the upper support plate 9.

According to the aforementioned structures, the loading and unloading method for the quartz reaction tube of the semiconductor diffusion equipment of the present invention includes a loading procedure and an unloading procedure; the loading procedure includes the following steps:

Step S11, placing the first interface unit of the auxiliary support structure on the bracket; placing the bottom of the quartz reaction tube into the second interface unit of the auxiliary support structure;

Step S12, actuating the handle to dock the front end of the translation drive structure with the doorframes of the semiconductor diffusion equipment through the fixing structure;

Step S13, actuating the bracket to horizontally move the quartz reaction tube along the linear guide rail to dock with the interfacing flange of the lifting gear;

Step S14, using the lifting device to lift the quartz reaction tube with the auxiliary support structure up into semiconductor diffusion equipment chamber of the semiconductor diffusion equipment;

The unloading procedure includes following steps:

Step S21, actuating the handle to dock the front end of the translation drive structure with the doorframes of the semiconductor diffusion equipment by the fixing structure;

Step S22, using the lifting device to lower the quartz reaction tube with the auxiliary support structure out of the reaction chamber of the semiconductor diffusion equipment;

Step S23, placing the first interface unit of the auxiliary support structure on the bracket;

Step S24, releasing the quartz reaction tube from the interfacing flange of the lifting device; actuating the bracket to move the quartz reaction tube along the linear guide rail back into the support platform;

Step S25, releasing the front end of the translation drive structure from the doorframes of the semiconductor diffusion equipment, and then using the handle to move the quartz reaction tube away from the semiconductor diffusion equipment.

The procedure for loading the outer tube of the quartz reaction tube into the semiconductor diffusion equipment according to the embodiment of the present invention will now be descried more comprehensively hereinafter with reference to FIG. 4 to FIG. 18.

Figure 4:
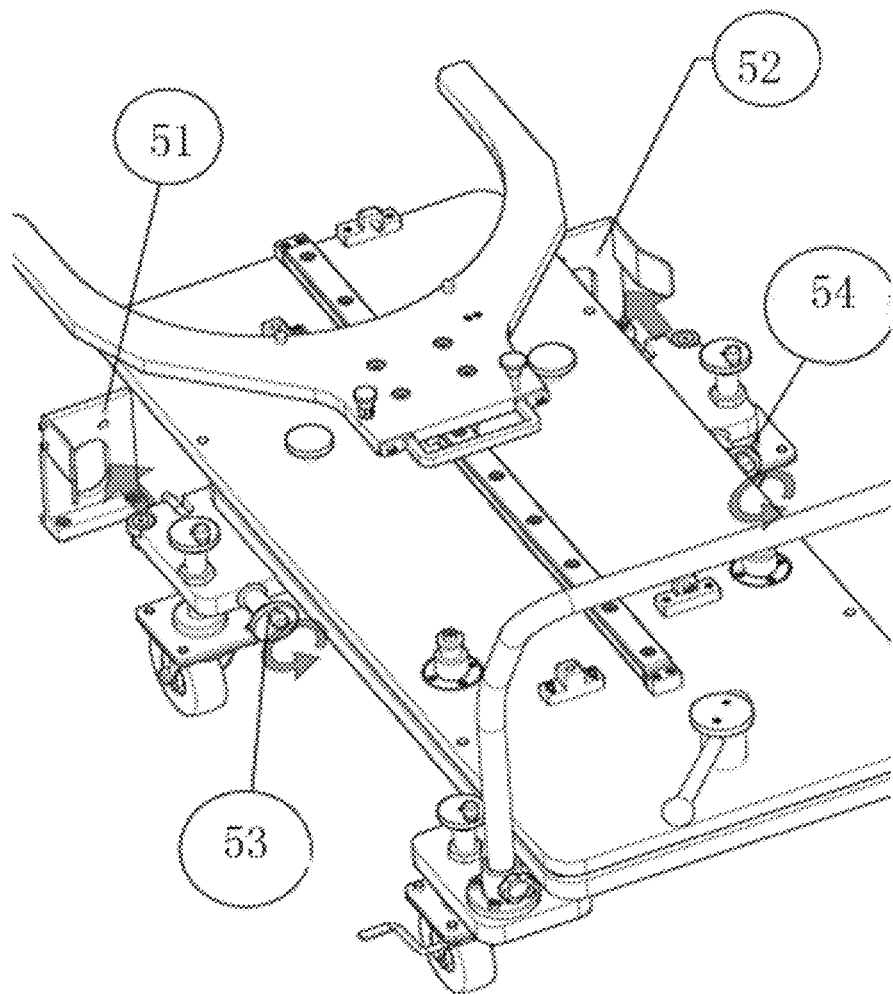
FIGS. 4 to 17 are views illustrating the loading procedure of the outer tube of the quartz reaction tube into the semiconductor diffusion equipment according to one embodiment of the present invention.

Referring to FIG. 4, firstly the fixing screws 53 and 54 at the left and right sides of the loading and unloading trolley are disassembled and then the left and right locating block 51 and 52 are removed.

Figure 5:
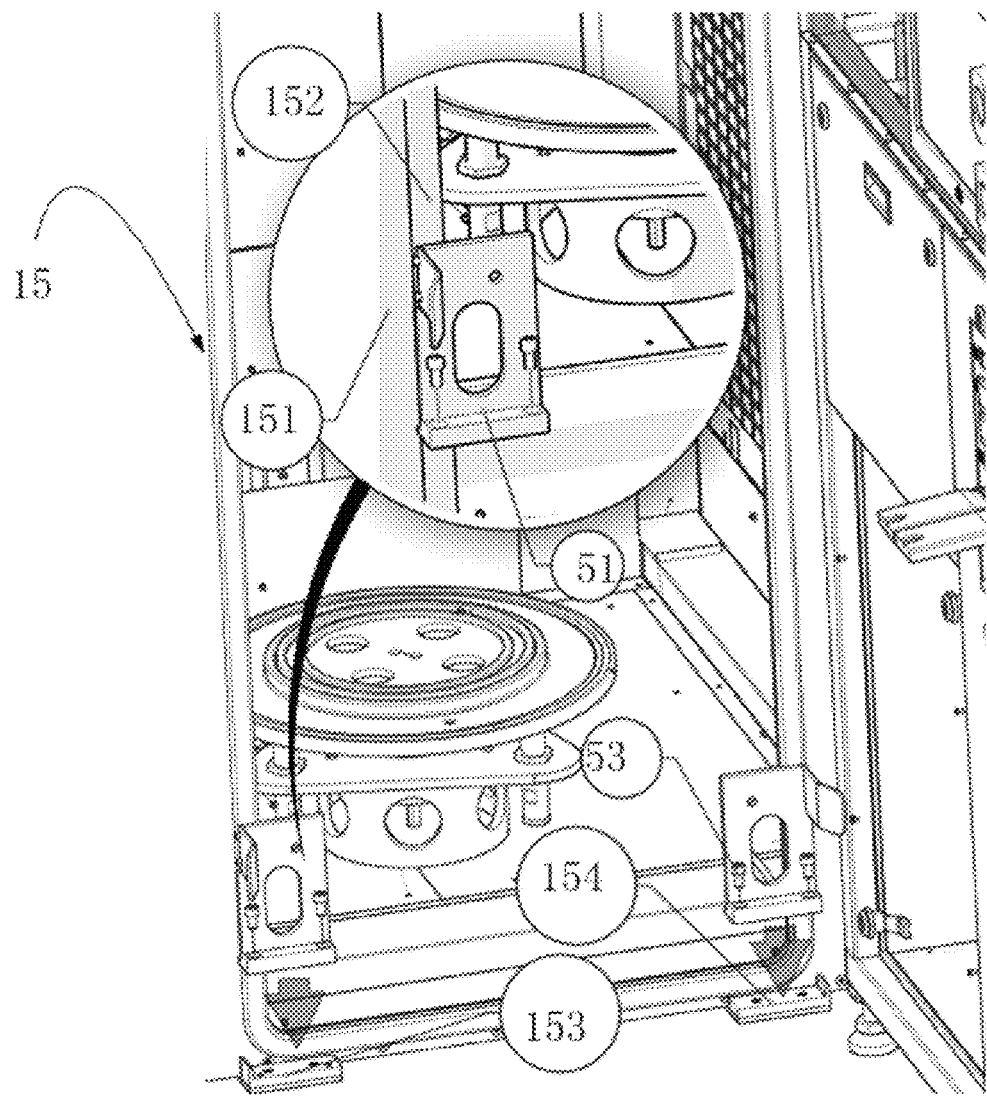

Referring to FIG. 5, the left and right locating block 51 and 52 are respectively fixed on the locating block 153 and 154 at the doorframe 151 of the back door 15 by setscrews.

It is noted that the two locating block 153 and 154 are hold closely to a back sealing plate at a lower step of the doorframe 151, a sealing ring 152 of the back door is fitted in the gap of about 10 mm between each of the locating blocks and the back sealing plate. In the loading procedure, attention should be paid to prevent the sealing ring 152 of the back door from being scratched.

Figure 6:
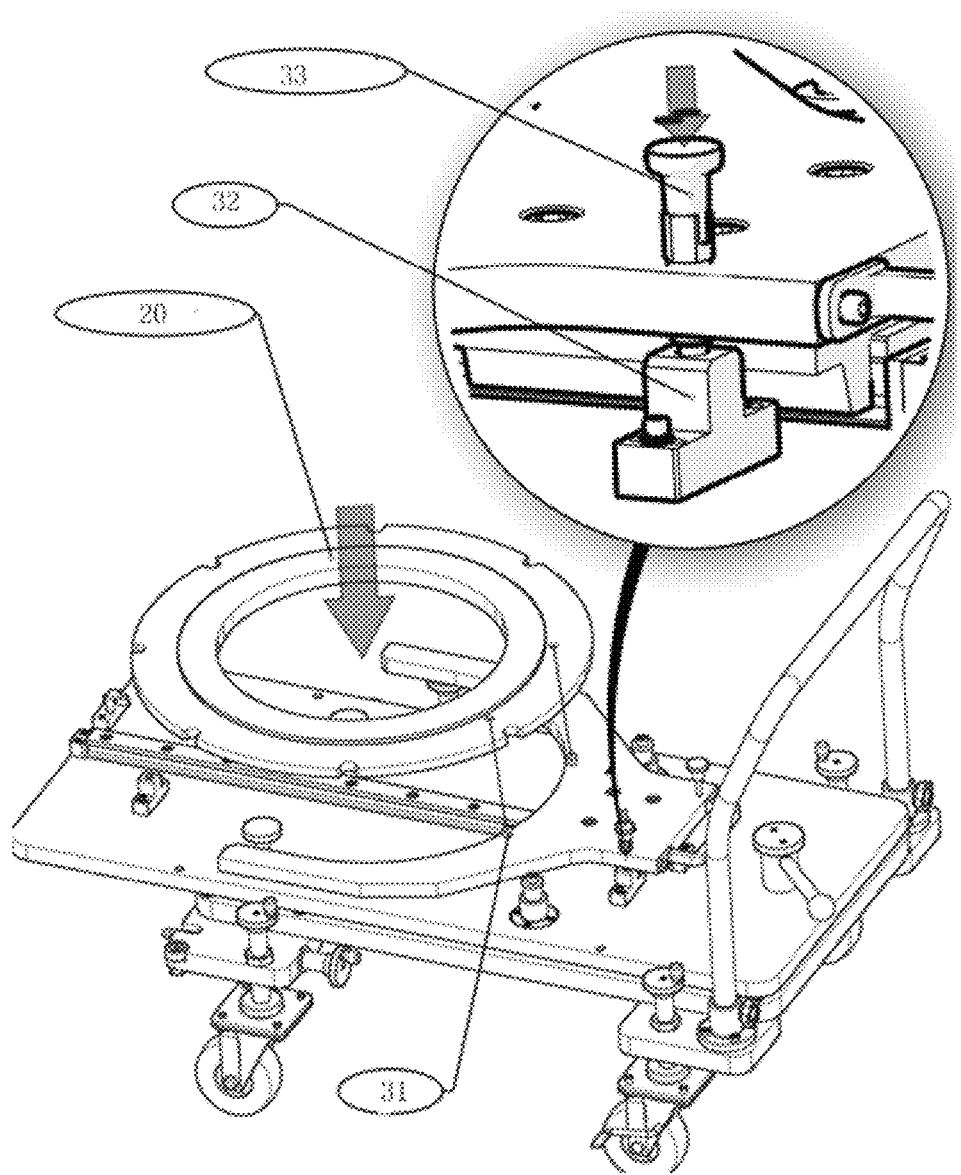

Referring to FIG. 6, the pluggable locating pin 33 mounted on the bracket 3 is plugged into the locating block 32, thus the bracket 3 is positioned at the back end of the trolley through the locating block 32 and the locating pin 33 and cannot be moved. Then the auxiliary support structure 20 of the quartz outer tube is placed on the bracket 3 by aligning the two holes 31 in the edge ring 201 to the correspondent two locating pins 33 on the bracket 3. It is noted that the upper and lower surface of the auxiliary support structure 20 of the quartz outer tube should not be reversed.

Figure 7:
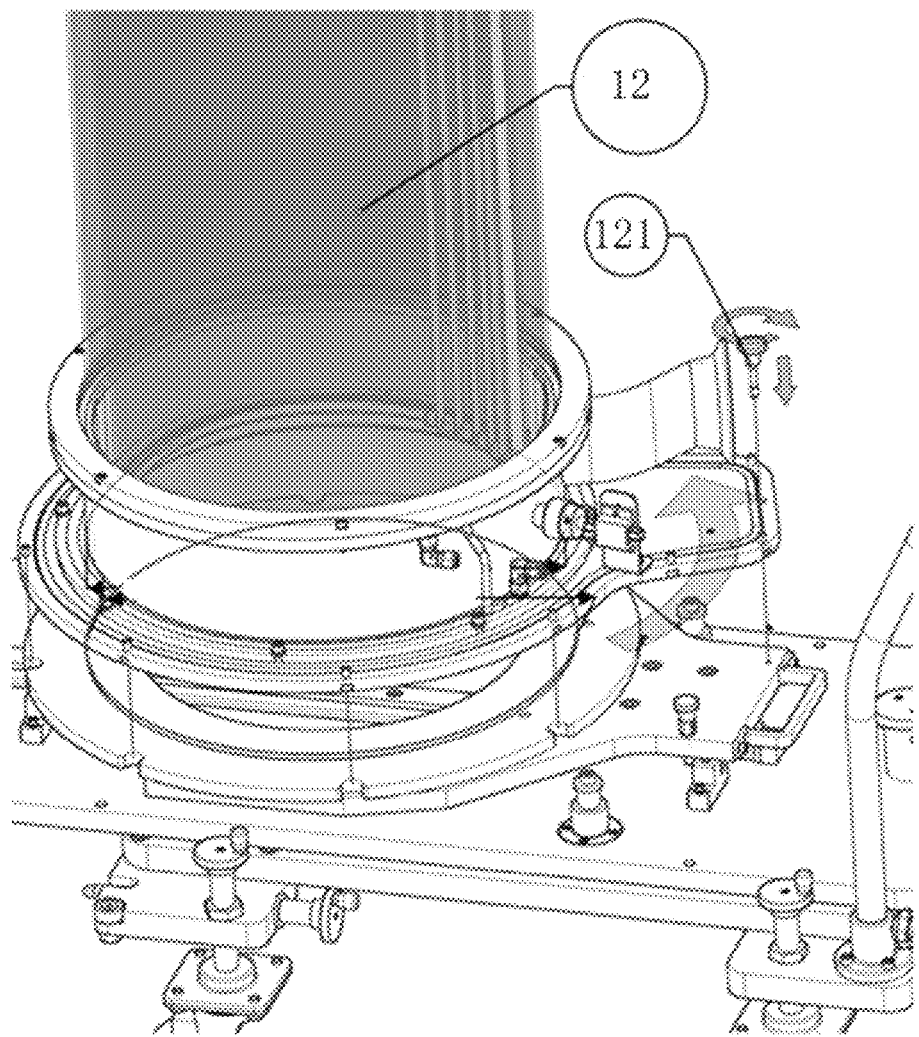

Referring to FIG. 7, when the reaction tube assembly 12 is placed on the auxiliary support structure 20 of the quartz outer tube, the inner hole of the reaction tube assembly 12 and the outer circular of the upper end of the auxiliary support structure 20 need to be attached together and concentric. And then the overall reaction tube assembly 12 is rotated so as to make the fixing through-hole 121 of the reaction tube assembly 12 align with the thread hole of the bracket 3. After that, a fixing rod is inserted into the fixing through-hole 121 and the thread hole of the bracket 3 so as to connect the reaction tube assembly 12 and the bracket 3, thus the reaction tube assembly 12 is completely fixed on the bracket 3. It is noted that the seven assembly thread through-holes 121 should be corresponded one by one to the seven half-circular holes in the auxiliary support structure 20 of the quartz outer tube.

Figure 8:
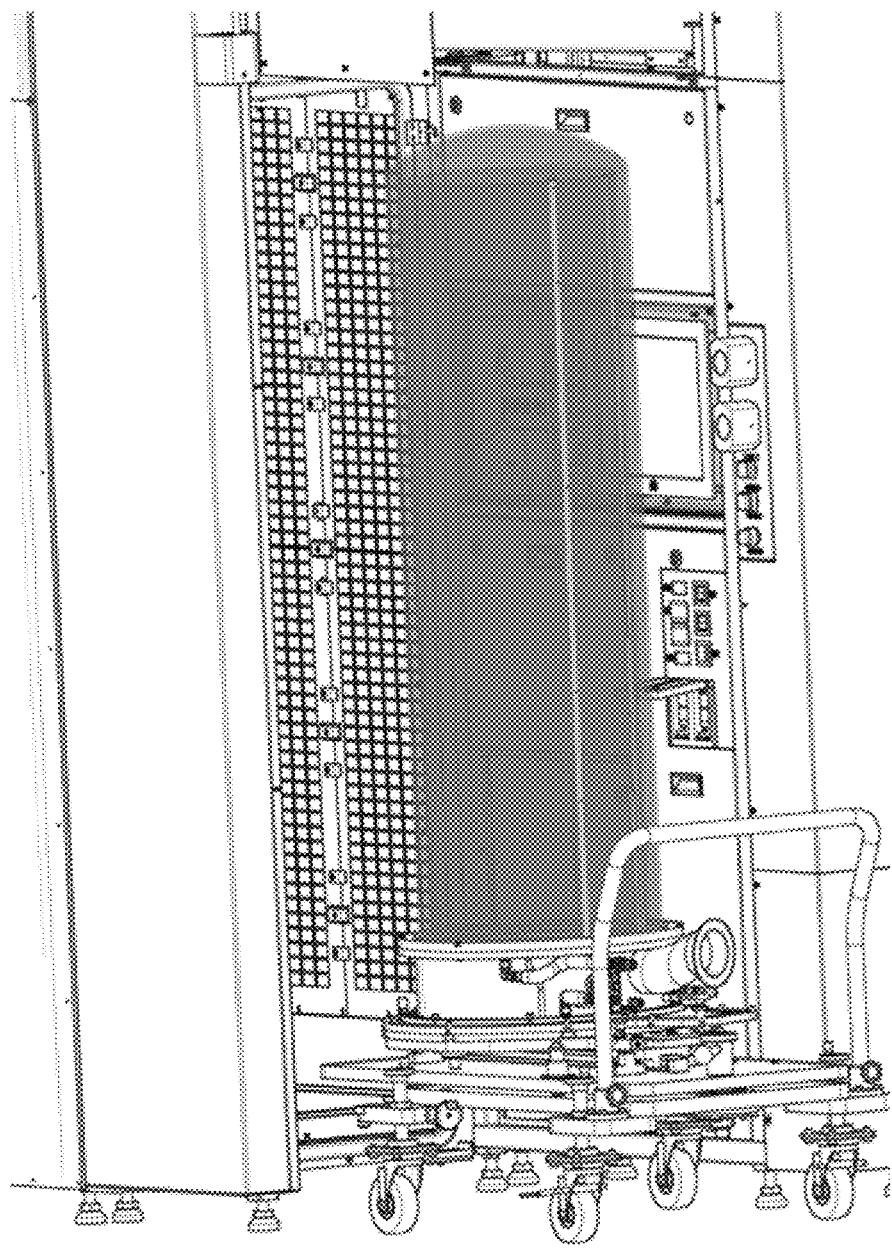

Referring to FIG. 8, the loading and unloading trolley is moved slowly to the position between the control cabinet at the side of the equipment and the control cabinet at the back of the equipment.

Figure 9:
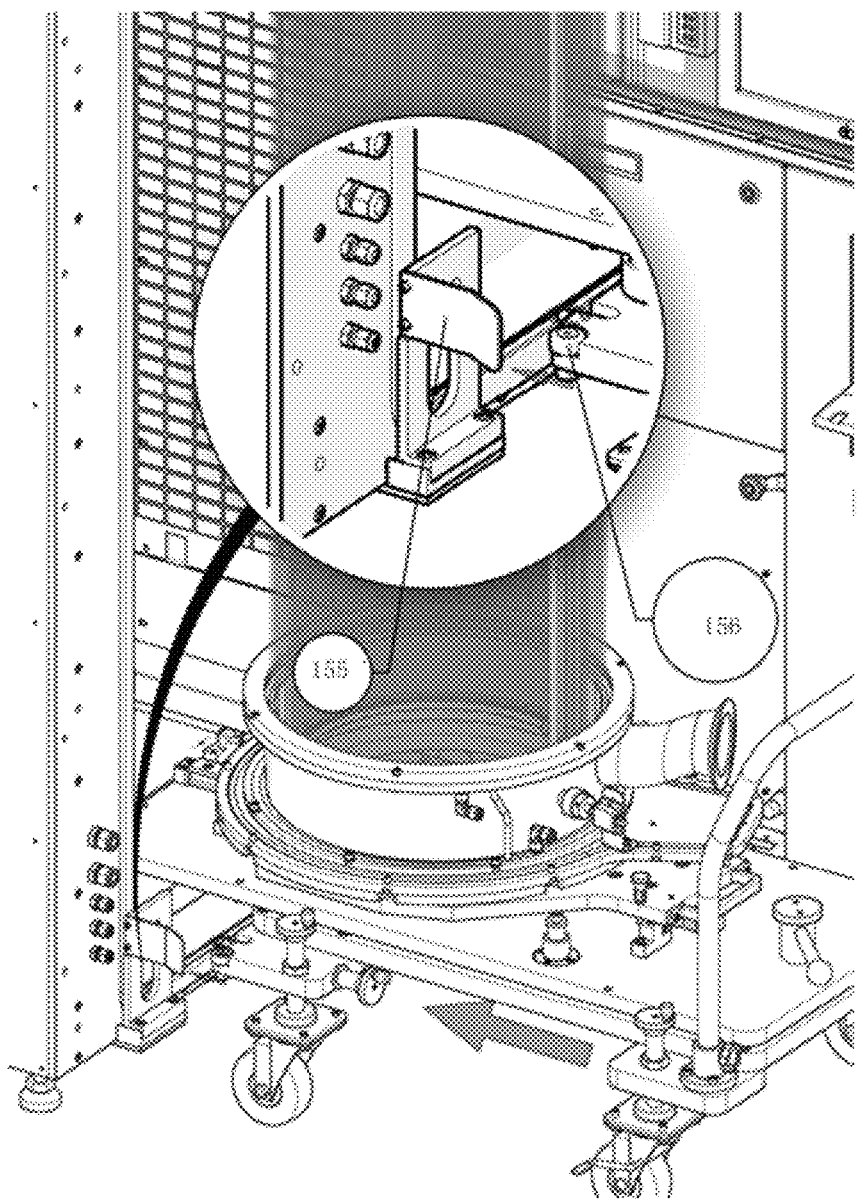

Referring to FIG. 9, the cam guide device 156 at the front end of the loading and unloading trolley is attached slowly on the guide plate 155 of the locating block, and then the trolley is moved forward along the same direction to be attached to the front surface of the locating block.

Figure 10:
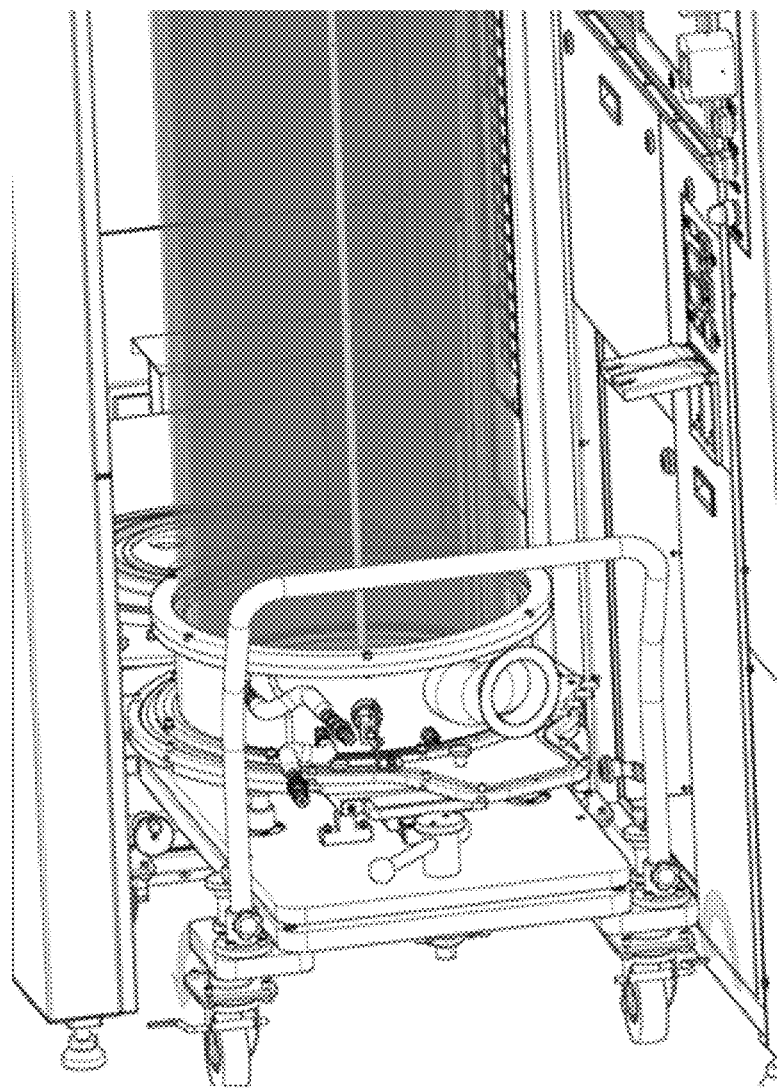

Referring to FIG. 10, the two baffle plates of the back rollers are braked, so as to locate the handling vehicle.

Figure 11:
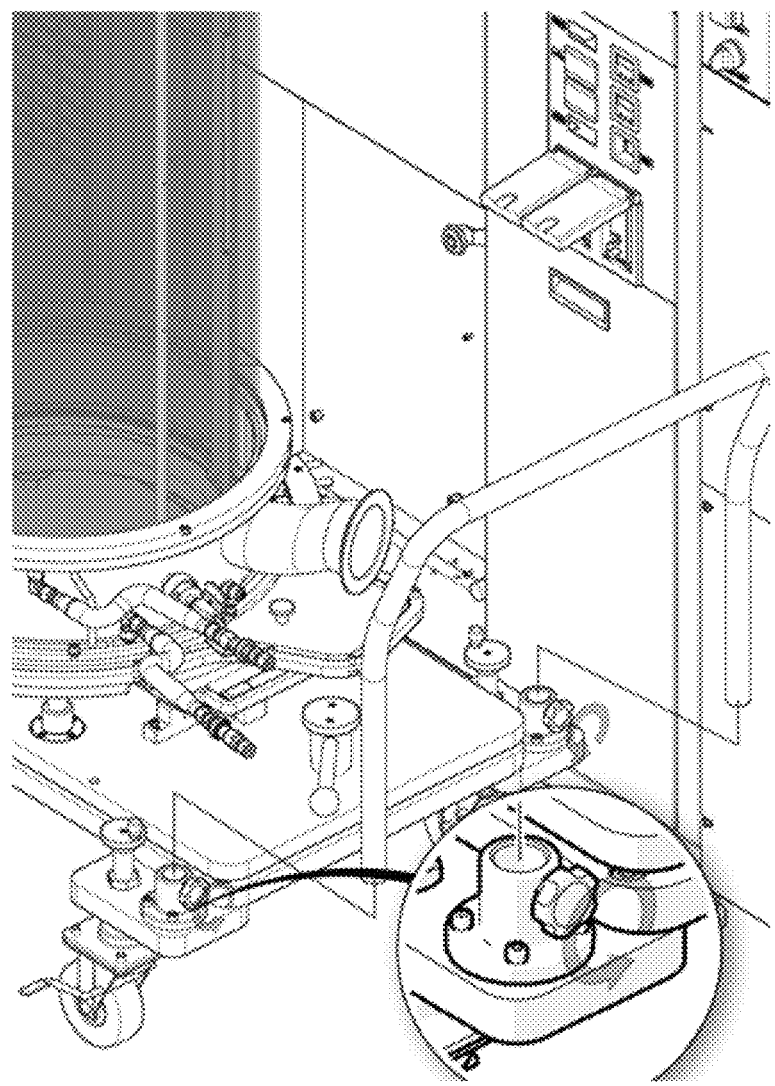

Referring to FIG. 11, the knobs on the two sides of the bottom end of the handle 1 is unscrewed, so as to remove the handle 1.

Figure 12:
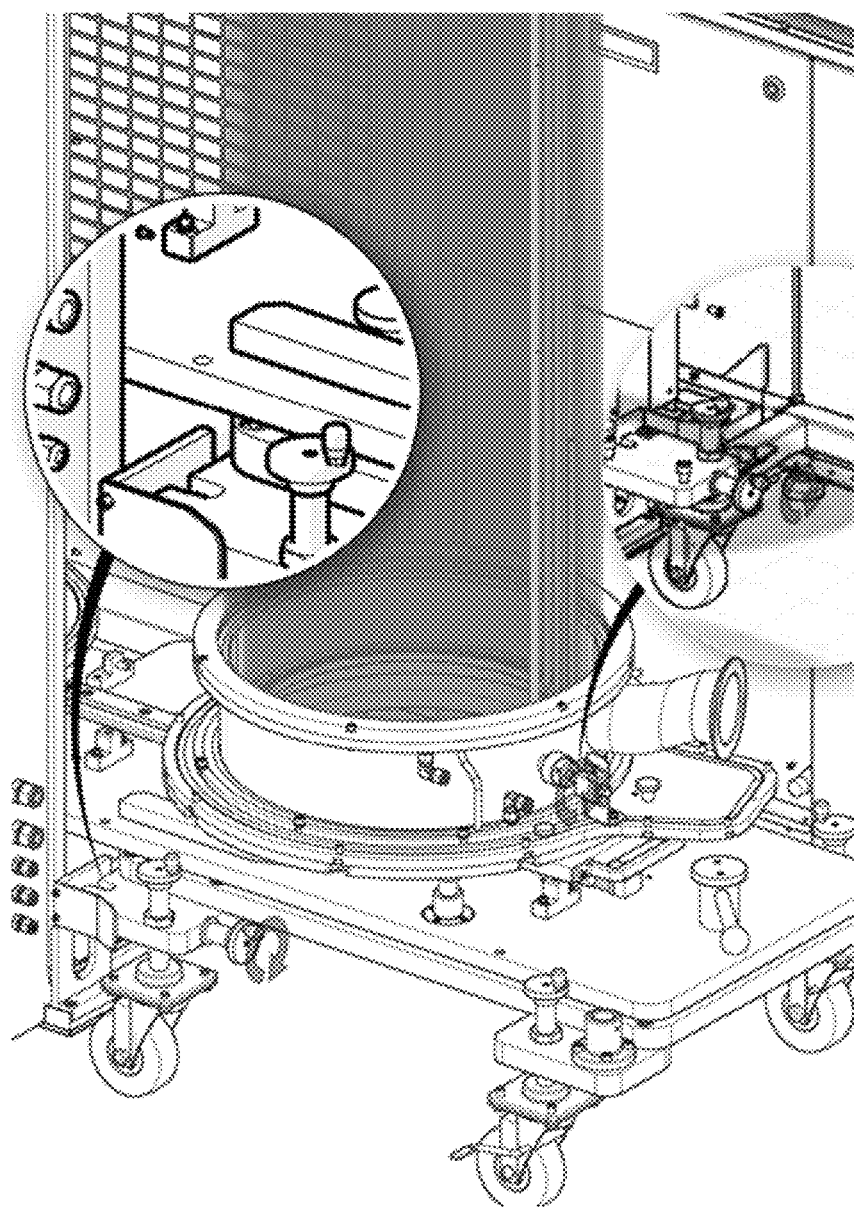

Referring to FIG. 12, the fixing screw rods on the two left and right sides of the loading and unloading trolley is screwed to make the front end surface of the trolley attached closely to the front surface of the locating block, whereby fixing and connecting the loading and unloading trolley and the diffusion equipment.

Figure 13:
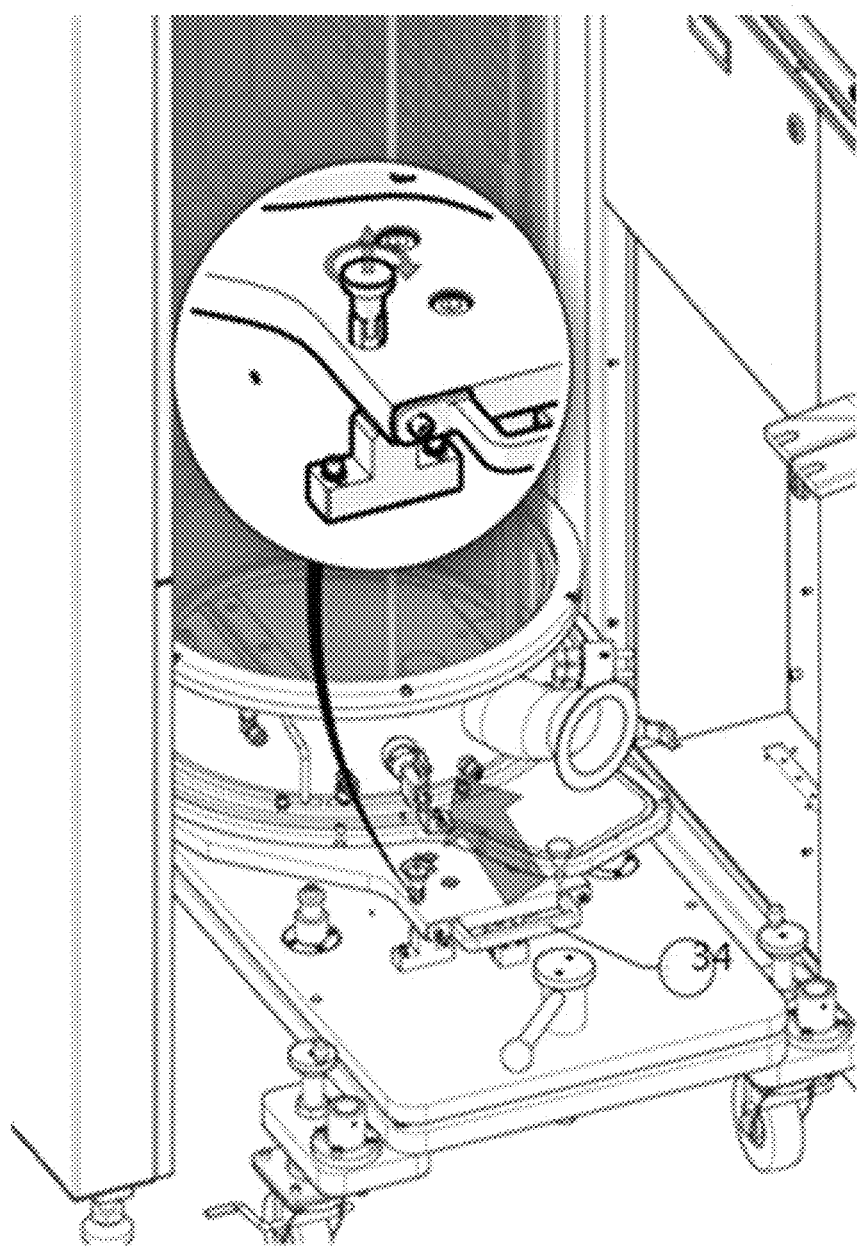

Referring to FIG. 13, while the handle 34 is hold on, the pluggable locating pins are rotated and pulled out firstly; and then the bracket 3 and the reaction tube assembly 12 are moved forward together slowly.

Figure 14:
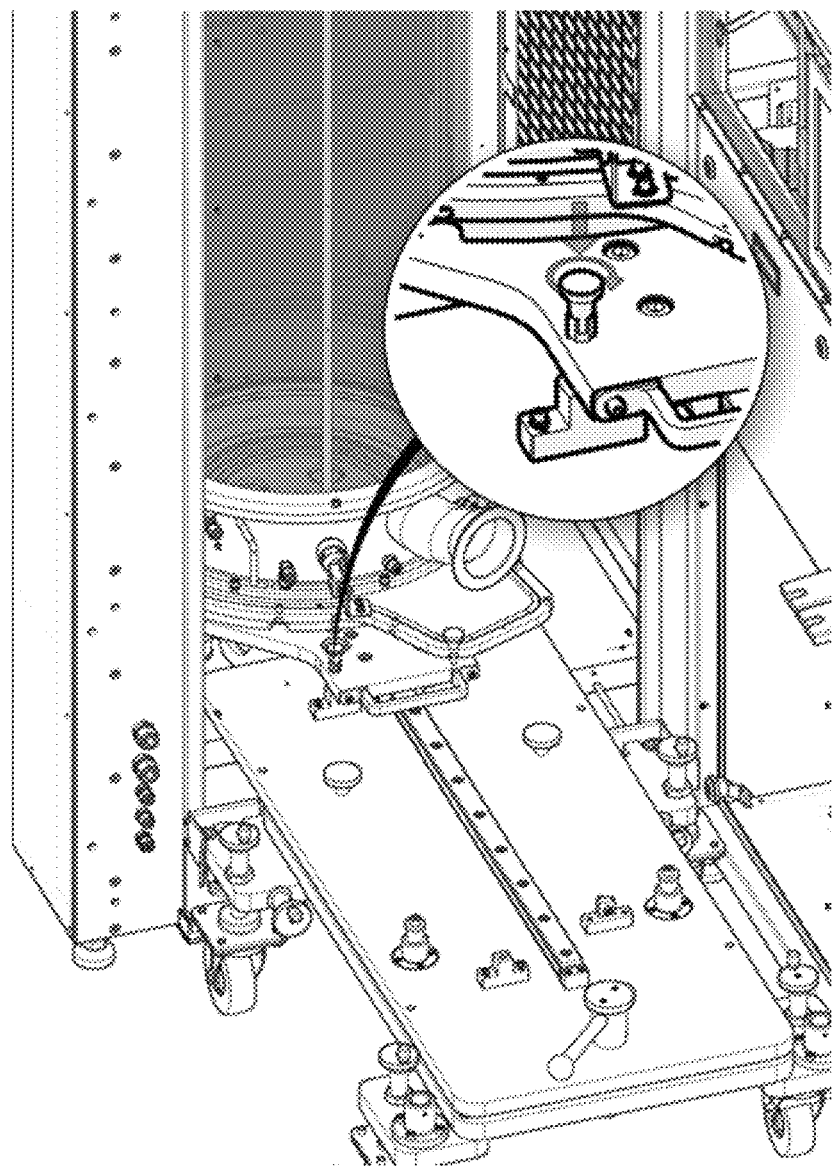

Referring to FIG. 14, when the bracket 3 cannot be moved ahead any more, the pluggable locating pins are rotated and inserted down into the lower locating block.

Figure 15:
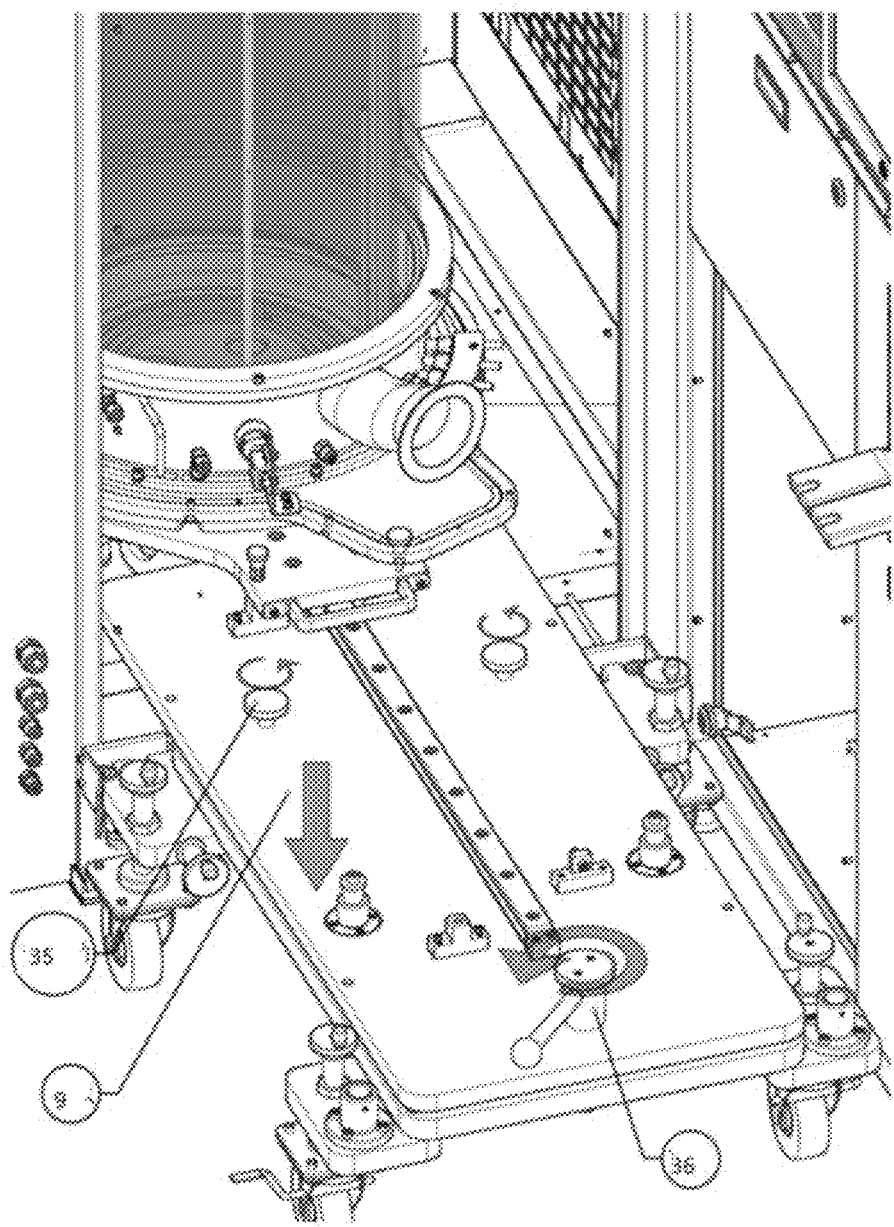

Referring to FIG. 15, the support shaft 35 is unscrewed and then the support rod 36 is rotated, so as to move down the upper support plate 9 together with the bracket 3 and reaction tube assembly 12.

Figure 16:
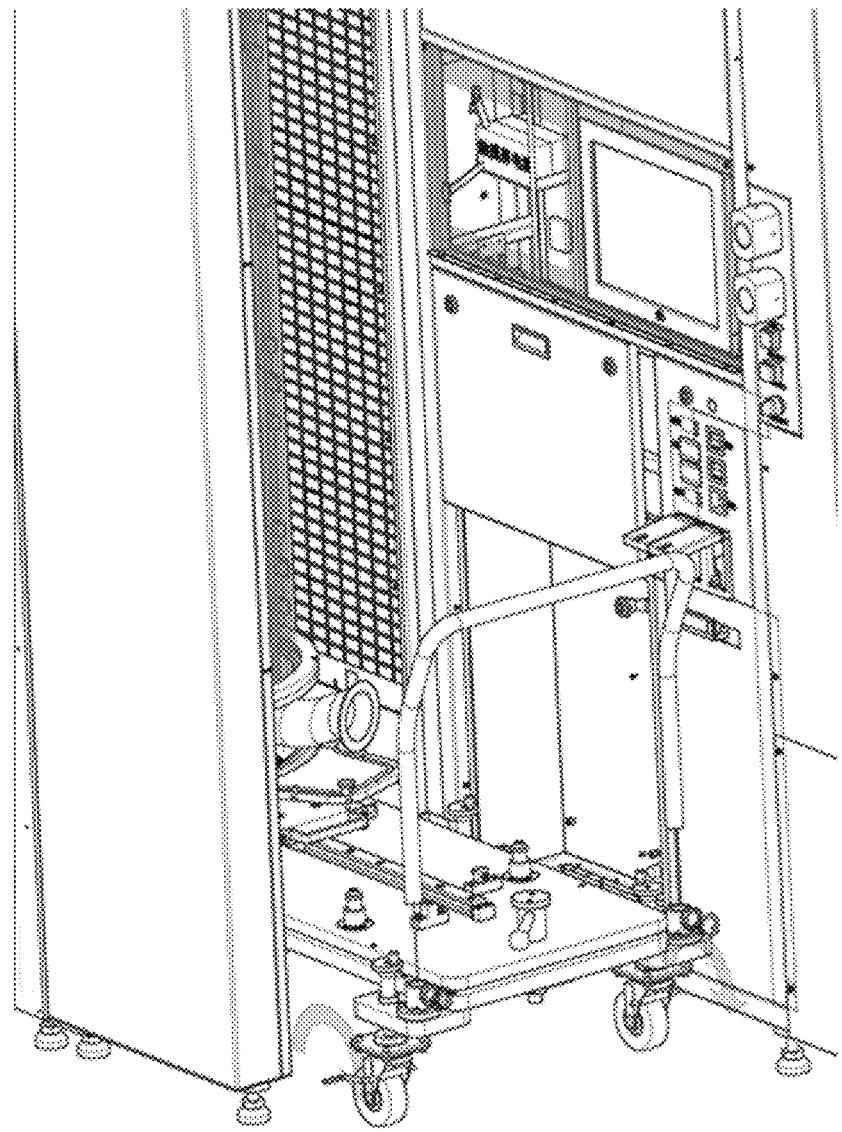

Referring to FIG. 16, the reaction tube assembly 12 is placed slowly on the water-cooling plate of the process door and the support rod 36 is kept rotating, so as to move the bracket 3 away from the reaction tube assembly 12 about 2 mm.

Figure 17:
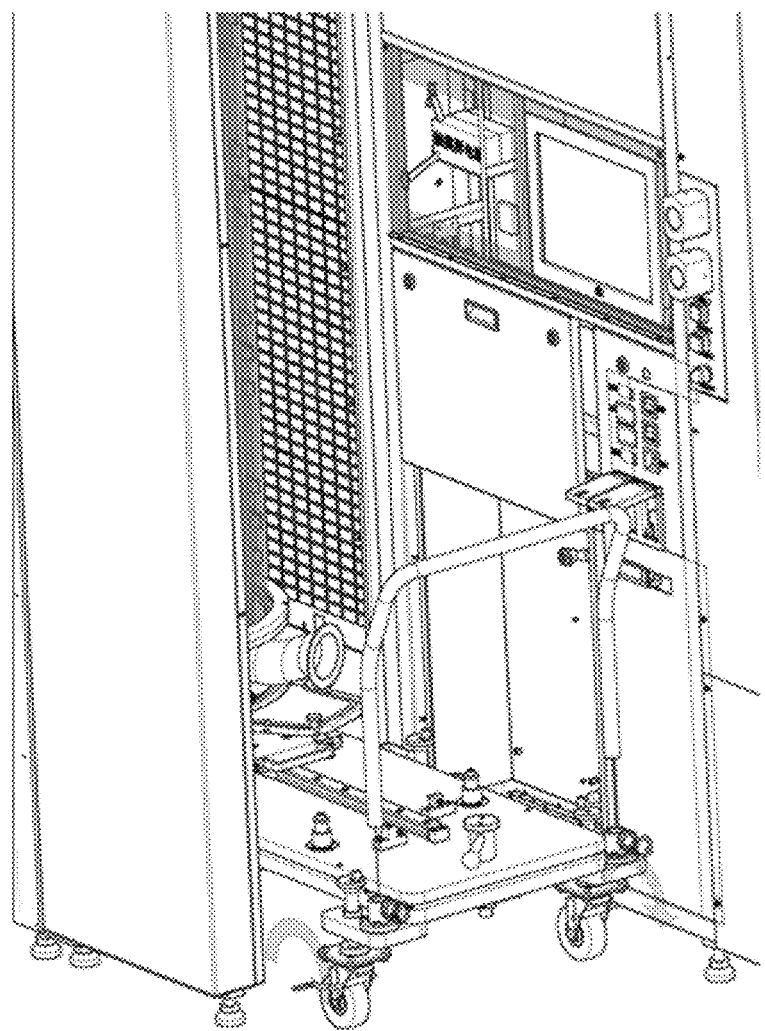

Referring to FIG. 17, the handle 1 is installed and fixed by the knob; then the brakes of the back rollers are released to move the loading and unloading trolley out.

According to the steps mentioned above of the present invention, the outer tube of the quartz reaction tube can be installed on the lifting device to be placed into the reaction chamber.

Figure 18:
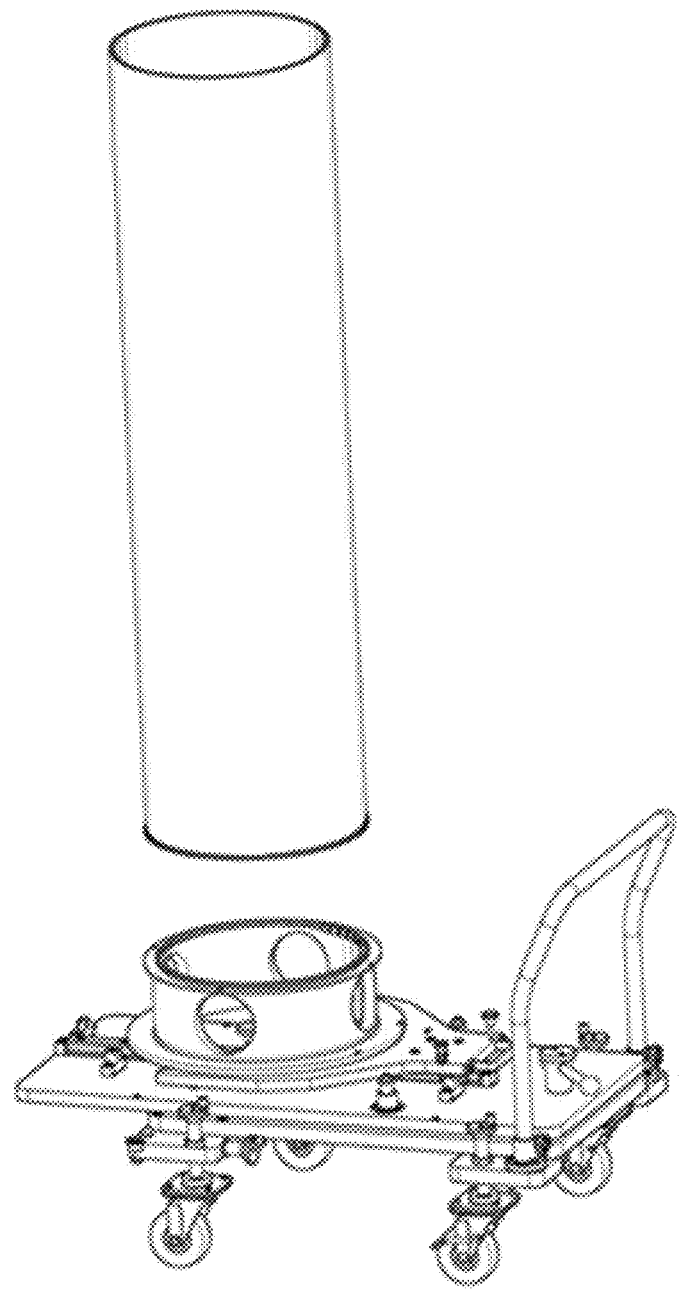
FIG. 18 is a view illustrating loading the inner tube of the quartz reaction tube into the semiconductor diffusion equipment according to one embodiment of the present invention.

FIG. 18 is a view illustrating the loading method of the quartz reaction inner tube of the semiconductor diffusion equipment according to the embodiment of the present invention; as shown in FIG. 18, the loading procedure of the inner quartz tube is similar to that of the outer tube, which will not be described herein.

While this invention has been particularly shown and described with references to preferred embodiments thereof, if will be understood by those skilled in the art that various changes in form and details may be made herein without departing from the spirit and scope of the invention as defined by the appended claims.

The invention claimed is:

1. A loading and unloading device for a quartz reaction tube of a semiconductor diffusion equipment, which is used in combination with a lifting device having an interface flange attachable to the quartz reaction tube, including:
   a translation drive structure including a support platform composed of an upper support plate and a lower support plate stacked up and down, and a handle connected to the support platform; wherein the lower support plate is fixedly connected to a group of height-adjustable rollers;
   a linear guide rail mounted on the upper support plate;
   a bracket positioned on the linear guide rail;
   an auxiliary support structure working in conjunction with the bracket to detachably fix the quartz reaction tube to the bracket, which includes a first interface unit to be connected to the bracket and a second interface unit to be connected to a bottom assembly of the quartz reaction tube, wherein the quartz reaction tube includes an inner tube and an outer tube; the second interface unit includes at least an inner tube interface unit to be connected to the bottom assembly of the inner tube of the quartz reaction tube and/or at least an outer tube interface unit to be connected to the bottom assembly of the outer tube of the quartz reaction tub;
   wherein during the loading procedure, a front end of the translation drive structure is docked with doorframes of the semiconductor diffusion equipment by a fixing structure, and the quartz reaction tube is docked with the interface flange of the lifting device by horizontally moving the bracket along the linear guide rail.

2. The loading and unloading device according to claim 1, wherein the bracket includes a semi-annulus support surface having multiple locating pins provided thereon; the outer tube interface unit includes a hollow cylinder, an edge ring positioned around the periphery of the cylinder and adjoined with the first interface unit, multiple locating holes formed in the edge ring to be engaged with the locating pins on the support surface, and multiple semicircular notches distributed on the periphery of the edge ring; the quantity and position of the semicircular notches are correspondent to those of thread through-holes formed in the bottom assembly of the quartz reaction outer tube.

3. The loading and unloading device according to claim 1, wherein the bracket includes a semi-annulus support surface having multiple locating pins provided thereon; the inner tube interface unit includes a hollow cylinder, an edge ring positioned around the periphery of the cylinder and adjoined with the first interface unit, multiple locating holes formed in the edge ring to be engaged with the locating pins on the support surface; wherein the hollow cylinder has an annulus protrusion formed at the end away from the edge ring.

4. The loading and unloading device according to claim 1, wherein the space between the two stacked support plates is controlled by a space adjusting unit.

5. The loading and unloading device according to claim 4, wherein the space adjusting unit is a rotating and lifting mechanism with a rotating handle.

6. The loading and unloading device according to claim 1, wherein the handle is a lifting handle and is detachably fixed and connected to the support platform.

7. The loading and unloading device according to claim 1, wherein the front end of the translation drive structure is docked with the doorframes of the semiconductor diffusion equipment through locating blocks and locating pins.

8. The loading and unloading device according to claim 1, wherein the lower support plate has multiple linear guide pillars engaged into through holes of the upper support plate.

9. A method using the device according to claim 1 to load and unload the reaction tube of the semiconductor diffusion equipment, including a loading procedure and an unloading procedure; the loading procedure includes the following steps:

Step S11, placing the first interface unit of the auxiliary support structure on the bracket; placing the bottom of the quartz reaction tube into the second interface unit of the auxiliary support structure;

Step S12, actuating the handle to dock the front end of the translation drive structure with the doorframes of the semiconductor diffusion equipment through the fixing structure;

Step S13, actuating the bracket to horizontally move the quartz reaction tube along the linear guide rail to dock with the interface flange of the lifting device;

Step S14, using the lifting device to lift the quartz reaction tube with the auxiliary support structure up into the reaction chamber of the semiconductor diffusion equipment;

the unloading procedure includes the following steps:

Step S21, actuating the handle to dock the front end of the translation drive structure with the doorframes of the semiconductor diffusion equipment through the fixing structure;

Step S22, using the lifting device to lower the quartz reaction tube with the auxiliary support structure out of the reaction chamber of the semiconductor diffusion equipment;

Step S23, placing the first interface unit of the auxiliary support structure on the bracket;

Step S24, releasing the quartz reaction tube from the interface flange of the lifting device; actuating the bracket to move the quartz reaction tube along the linear guide rail back into the support platform;

Step S25, releasing the front end of the translation drive structure from the doorframes of the semiconductor diffusion equipment, and then using the handle to move the quartz reaction tube away from the semiconductor diffusion equipment.

* * * * *